United States Patent [19]
Hurley

[11] Patent Number: 4,625,283
[45] Date of Patent: Nov. 25, 1986

[54] METHOD AND APPARATUS FOR DIGITALLY MEASURING ALTERNATING CURRENT

[75] Inventor: James R. Hurley, Brookfield, Wis.

[73] Assignee: Cooper Industries, Inc., Houston, Tex.

[21] Appl. No.: 375,830

[22] Filed: May 7, 1982

[51] Int. Cl.$^4$ .................... H02H 3/08; G06F 15/324; G01R 19/04
[52] U.S. Cl. .................. 364/487; 324/77 A; 361/93; 364/483
[58] Field of Search ................ 324/77 A, 83 R, 83 D; 364/480, 481, 483, 487; 361/57, 93

[56] References Cited

U.S. PATENT DOCUMENTS

| | | | |
|---|---|---|---|
| 3,663,956 | 5/1972 | Purdy et al. | 324/83 |
| 3,731,152 | 5/1973 | Rockefeller, Jr. | 364/487 X |
| 3,758,763 | 9/1973 | Nohara et al. | 364/487 X |
| 3,944,935 | 3/1976 | Plant | 328/140 |
| 4,051,470 | 9/1977 | Esteban et al. | 340/347 AD |
| 4,069,452 | 1/1978 | Conway et al. | 324/103 P |
| 4,073,008 | 2/1978 | Andow et al. | 364/483 X |
| 4,073,009 | 2/1978 | Andow et al. | 364/483 X |
| 4,074,190 | 2/1978 | Bunting | 324/77 A |
| 4,075,697 | 2/1978 | Ochiai et al. | 364/481 |
| 4,283,713 | 8/1981 | Philip | 324/121 R X |
| 4,291,356 | 9/1981 | Mathieu | 361/93 X |
| 4,333,151 | 6/1982 | Matsushima | 364/483 X |
| 4,375,072 | 2/1983 | Rice | 364/483 X |
| 4,497,010 | 1/1985 | Funahashi | 361/93 |

Primary Examiner—Felix D. Gruber
Attorney, Agent, or Firm—Nelson A. Blish; Eddie E. Scott; Alan R. Thiele

[57] ABSTRACT

The method of the present invention encompasses comparing the instantaneous value of a waveform with at least two reference voltages, $-R$ and $+R$, when crossing of these voltages occurs and processing this data in a data processor (46) to determine parameters of the waveform such as frequency and amplitude and of fundamental and DC offset.

The apparatus of the present invention includes comparators ($E_1$ and $E_2$) which senses the voltage crossings and which has outputs (28 and 30) inputted to a latch (36) and to logic circuitry (32). A counter (50) supplies a count to the latch (36) and the output of the latch (36) is coupled to a microprocessor (46). The logic circuitry (32) has an output (34) coupled to the latch and to the microprocessor (46) first for causing, when a crossing occurs, the latch (36) to latch data identifying the particular crossing made and a count of the time it occurred and second to cause the microprocessor (46) to input this latched data and then to reset the logic circuitry.

22 Claims, 3 Drawing Figures

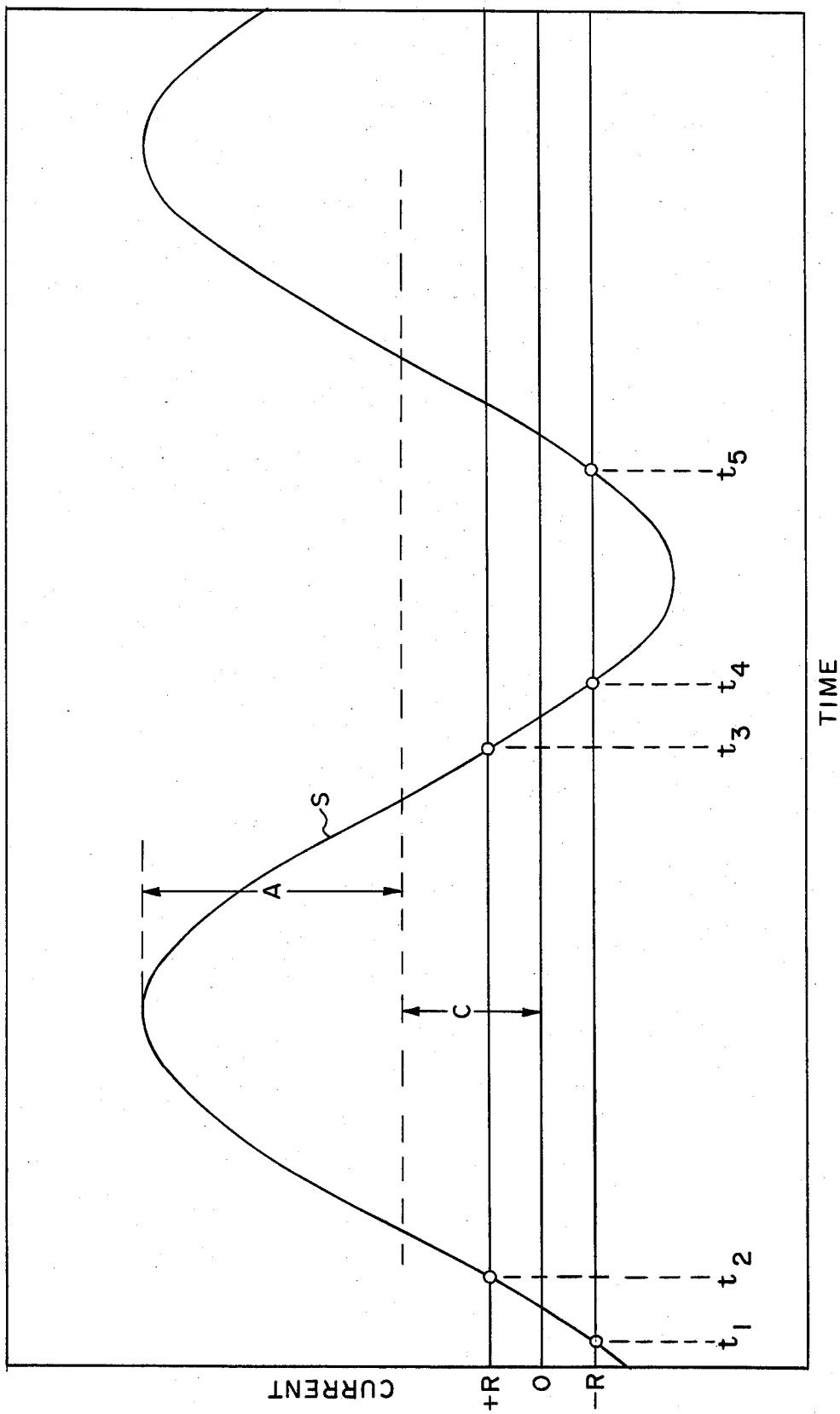

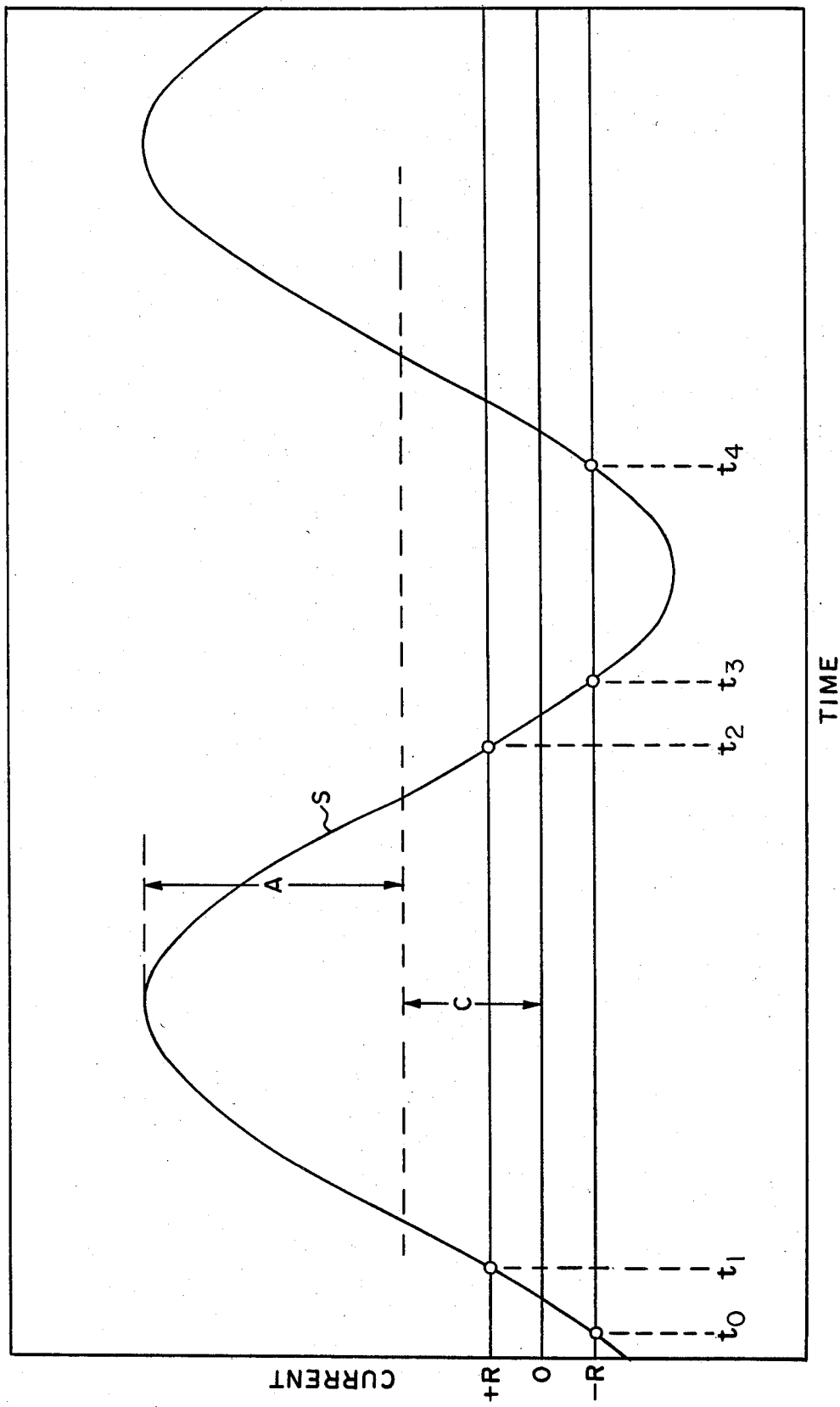

METHOD AND APPARATUS FOR DIGITALLY MEASURING ALTERNATING CURRENT

TECHNICAL FIELD

The present invention relates to a method and apparatus for digitally measuring alternating current. More specifically, the method and apparatus utilize digital processing circuitry for measuring alternating current.

BACKGROUND ART

Heretofore various circuits have been proposed for measuring alternating current. These previous circuits measured various parameters such as zero crossings and maximum amplitude of alternating current waveforms. Some of these circuits included sample and hold circuits, comparators, pulse shapers, ramp generators and/or other wave sensing and analyzing circuitry. The data acquired was processed with analog and/or digital computer circuitry.

Examples of such previously proposed circuits for measuring parameters of an alternating waveform, voltage or current, are disclosed in the following U.S. Patents.

| U.S. Pat. No. | PATENTEE |
|---|---|
| 3,663,956 | Purdy et al. |
| 3,731,152 | Rockefeller, Jr. |
| 3,758,763 | Nohara, et al. |
| 3,944,935 | Plant |
| 4,051,470 | Esteban, et al. |
| 4,069,452 | Conway, et al. |
| 4,073,008 | Andow et al. |
| 4,073,009 | Andow, et al. |
| 4,074,190 | Bunting |
| 4,283,713 | Philipp |

As will be described in greater detail hereinafter the method and apparatus of the present invention for measuring alternating current differ from the previously proposed circuits for measuring parameters of a waveform described in the patents identified above by providing digital circuitry for sensing at least two data points on an alternating current waveform, such data points being the crossing by the waveform of a negative reference voltage value and the crossing by the waveform of a positive reference voltage value, the absolute value of the negative reference voltage being equal to the absolute value of the positive reference voltage. The method and apparatus correlate fixed data points or amplitude values of the waveform with measured time intervals between the crossings by the waveform of the fixed amplitude values to estimate and measure parameters of the waveform such as frequency, amplitude and DC offset.

Moreover, the apparatus of the present invention differs from the previously proposed circuits for measuring parameters of a waveform by utilizing digital processing circuitry only and does not use an A/D converter.

Also, for the purpose of measuring frequency and DC offset, the method and apparatus of the present invention sense five reference voltage crossings. By measuring these five reference voltage crossings and the time intervals between these crossings, the method can be utilized in making a good estimation of the amplitude of the fundamental as well as the frequency and any DC offset of the waveform.

As will be described in greater detail hereinafter the method of the present invention as well as the apparatus for practicing the method encompasses measuring or noting the times at which the instantaneous value of an alternating waveform assumes (passes through or crosses) one or the other of two predetermined reference values. This differs from existing practice utilizing analog to digital converters where the measurements of the instantaneous values of the waveform are made at different prescribed times.

The method of the present invention is particularly adapted for digital measuring of an alternating waveform where it is desired to process the acquired waveform data or information in a microprocessor or other digital data processing equipment and provide advantages over systems which use an A/D converter and sample and hold circuitry. In this respect, A/D converters have high percentage quantization errors at low signal levels and unnecessary precision at high signal levels. In contradistinction with the method and apparatus of the present invention, there is high resolution of low level, signals and decreasing resolution as the signal level increases. These resolution characteristics are highly desired in overcurrent relaying.

Moreover, the apparatus of the present invention has fewer and less costly components, i.e., a comparator and a few logic gates, than are used in an A/D converter system, i.e., an expensive A/D converter and sample and hold circuitry. Additionally, the apparatus of the present invention has a much faster response time than conventional A/D converter systems.

DISCLOSURE OF THE INVENTION

According to the invention there is provided a method for measuring and monitoring an alternating current comprising the steps of: developing a voltage waveform directly related to the alternating current to be measured and monitored; sensing wnen the voltage waveform exceeds or falls below a predetermined negative reference voltage and remembering the point in time $t_1$ when this occurs; sensing when the voltage waveform exceeds or falls below a predetermined positive reference voltage and remembering the point in time $t_2$ when this occurs; comparing $t_2-t_1$ with a predetermined $\Delta T$ and when $t_2-t_1$ is less than $\Delta T$, causing a control signal to be generated for actuating a circuit interrupter in the line carrying the alternating current.

Also there is provided an apparatus for carrying out the method for measuring and monitoring an alternating current including: means for developing a voltage waveform directly related to the alternating current to be measured and monitored; first sensing means for sensing when the voltage waveform exceeds or falls below a predetermined negative reference voltage; memory means for remembering the point in time $t_1$ when this occurs; second sensing means for sensing when the voltage waveform exceeds or falls below a predetermined positive reference voltage; said memory means being operable to remember the point in time $t_2$ when this occurs; comparing means associated with said memory means and operable therewith for comparing $t_2-t_1$ with a predetermined $\Delta T$ and, when $t_2-t_1$ is less than $\Delta T$, said comparing means cause a control signal to be generated for actuating a circuit interrupter in the line carrying the alternating current.

Further according to the invention there is provided a method for measuring an alternating current waveform comprising the steps of: sensing when the waveform exceeds a predetermined negative reference value and remembering the point in time $t_1$ when this occurs; sensing when the waveform exceeds a predetermined positive reference value and remembering the point in time $t_2$ when this occurs; sensing when the waveform falls below the predetermined positive reference value and remembering the point in time $t_3$ when this occurs; sensing when the waveform falls below a predetermined negative reference value and remembering the point in time $t_4$ when this occurs; sensing when the waveform exceeds the predetermined negative reference value and remembering the point in time $t_5$ when this occurs; determining from $t_5-t_1$ the frequency of the waveform and determining from the negative and positive reference values and the time increments $t_2-t_1$, $t_3-t_1$, and $t_5-t_1$ the size of any DC offset and the amplitude of the fundamental of the waveform.

Still further there is provided an apparatus for carrying out the method for measuring an alternating waveform comprising first sensing means for sensing when the waveform exceeds a predetermined negative reference value; memory means for remembering the point in time $t_1$ when this occurs; second sensing means for sensing when the waveform exceeds a predetermined positive reference value; said memory means being operable to remember the point in time $t_2$ when this occurs; said second sensing means being operable to sense when the waveform falls below the predetermined positive reference value and said memory means being operable to remember the point in time $t_3$ when this occurs; said first sensing means being operable to sense when the waveform falls belowthepredetermined negative reference value and said memory means being operable to remember the point in time $t_4$ when this occurs; said first sensing means then being operable to sense when the waveform again exceeds the negative reference value and said memory means being operable to remember the point in time $t_5$ when this occurs; and data processing means for determining from $t_5-t_1$ the frequency of the waveform, and for determining from the negative and positive reference values and the time increments $t_2-t_1$, $t_3-t_1$, and $t_5-t_1$ the size of any DC offset present in the waveform and the amplitude of the fundamental of the waveform.

More specifically there is provided an apparatus for digitally measuring an alternating current comprising: means for transforming the alternating current waveform to a voltage waveform; means for sensing when the instantaneous value of the voltage waveform exceeds or falls below one or the other of two reference voltages; latch means coupled to the output of said sensing means; a counter coupled to the input to said latch means for supplying a count to said latch; said latch means being operable to latch simultaneously a voltage reference crossing sensed by said sensing means and the count in the counter at the time of the crossing; data processing means coupled to the output of said latch means; logic circuitry coupled to and between said sensing means, said latch means and said data processing means first for causing, after being actuated by a reference voltage crossing, said latch means to latch a reference voltage crossing and the count at that point in time in said latch means and second for causing said data processing means first to read the values latched in said latch means and second to send a reset signal to said logic circuitry for resetting same for the next reference voltage crossing.

BRIEF DESCRIPTION OF DRAWINGS

FIG. 2 is a graph of an offset sinusoidal AC current waveform.

FIG. 3 is a graph of an offset sinusoidal AC current waveform.

BEST MODE FOR CARRYING OUT THE INVENTION

Figure 1:
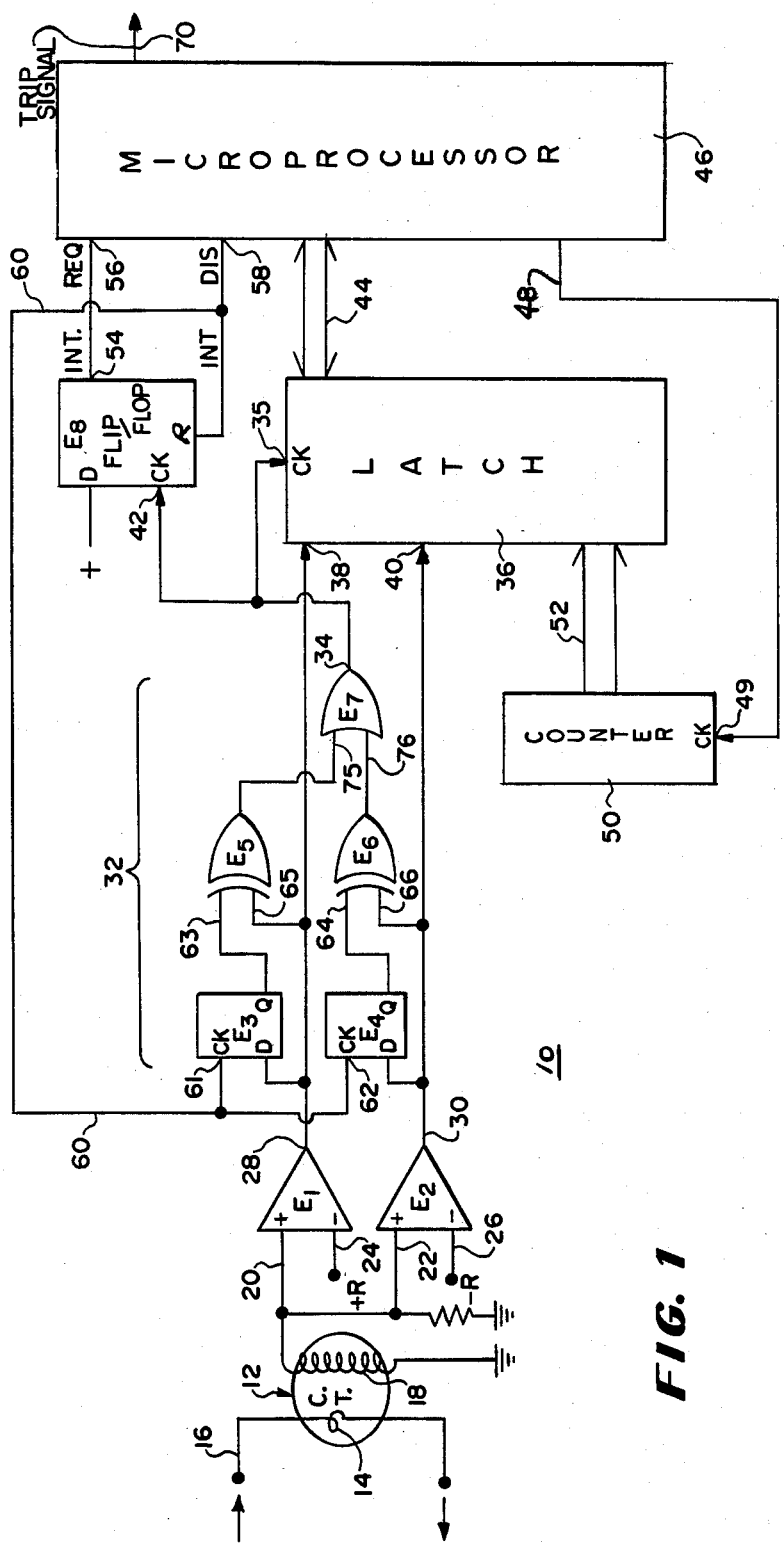
FIG. 1 is a schematic block diagram of the apparatus of the present invention for making a digital measurement of alternating current.

Referring now to the drawings in greater detail there is illustrated schematically in FIG. 1 an apparatus 10 for digitally measuring alternating current. The apparatus 10 includes a current transformer 12 which has at least one turn 14 of a line conductor 16 forming the primary winding or input to the current transformer 12. The current transformer 12 also has a multiturn secondary winding 18 which develops a voltage waveform S (FIG. 2) directly related to the line current. This voltage waveform S is applied to inputs 20 and 22 of first and second comparators $E_1$ and $E_2$.

The voltage waveform S supplied to the input 20 is compared by the comparator $E_1$ with a positive reference voltage +R applied to another input 24 thereof.

In a similar manner, the voltage supplied to the input 22 of the comparator $E_2$ is compared with a negative reference voltage −R supplied to an input 26 thereof. The absolute value of the negative reference voltage −R is equal to the absolute value of the positive reference voltage +R. The comparators $E_1$ and $E_2$ can each be realized by ¼ of an LM339 quad comparator.

As will be described in greater detail hereinafter when the instantaneous value of the voltage waveform S goes above or falls below the positive reference voltage +R, there is a change of the logic at output 28 of the comparator $E_1$. Likewise, when the instantaneous value of the voltage of the voltage waveform S goes above or drops below the negative reference voltage −R, there is a change of the logic at output 30 of the comparator $E_2$.

The apparatus 10 of the present invention practices the method of the invention by sensing and storing the time at which a transition occurs and then by sensing at least five transitions and determining the elapsed time between them, the method can determine a number of parameters of the waveform. More specifically, apparatus 10 can determine the frequency of the alternating current, any DC offset in the alternating current waveform and an estimation of the amplitude of the fundamental.

During steady state current flow in line conductor 16, i.e., when no fault currents are occurring, it can be assumed that the current waveform is comprised only of the fundamental. Then, by simple mathematical calculations, one can determine the amplitude of the waveform. Alternatively, one may calculate the root mean square (RMS) value of the waveform to make a measurement of the current.

Also, if the time between the crossing of the negative reference voltage −R and the positive reference voltage +R is below a certain critical ΔT, a control signal can be generated by the apparatus 10 for causing a circuit breaker to interrupt the flow of current in line conductor 16.

As apparent from FIG. 1, the apparatus 10 includes logic circuitry 32 for carrying out the method which logic circuitry 32 is coupled to the outputs 28 and 30 of the comparators $E_1$ and $E_2$. An output 34 of the logic circuitry 32 is coupled to a clock input 35 of a latch 36. The outputs 28 and 30 of the comparators $E_1$ and $E_2$ are supplied to inputs 38 and 40 of the latch 36. Additionally, the output 34 from the logic circuitry 32 is supplied to a clock input 42 of control flip flop $E_8$ The latch 36 is coupled by a bus 44 to a microprocessor 46, which can be an RCA 1802 device and which outputs a clock signal at 48 to a clock input 49 of a counter 50. Microprocessor 46 serves to perform calculations and as a memory means for remembering points in time and other data.

An output bus 52 from the counter 50 is coupled to the latch 36 for supplying a continuous count to the latch 36. Preferably, the latch 36 is realized by four bit D type latches with three state outputs so that they can either present data to the bus 44 when the SEL1 and SEL2 lines are brought to zero or maintain a high impedance state when those lines are at a logical one so as not to interfere with other activities on the bus 44.

Output 54 of flip flop $E_8$ is supplied to an interrupt input 56 of the microprocessor 46 and an interrupt dismiss output 58 from the microprocessor 46 is connected by an INTDIS line to reset input R of flip flop $E_8$. A line 60 couples the INTDIS line to the logic circuitry 32 also.

As shown, outputs 28 and 30 from comparators $E_1$ and $E_2$ inputted to inputs 38 and 40 of latch 36 will be either at logic 1 or logic 0. When the logic circuitry 32 senses a change in the output from one of the comparators $E_1$ or $E_2$, it sends a clock signal from output 34 to clock input 35 of latch 36 telling it to latch the logic values at inputs 38 and 40 and the count on the bus 52 from the counter 50.

The clock signal at output 34 is also sent to clock input 42 of flip flop $E_8$ to cause same to send an interrupt signal from output 54 to input 56 of microprocessor 46 telling it to examine the contents of the latch 36. After this is done by the microprocessor 46 it issues an interrupt dismiss signal to the reset R of flip flop $E_8$ and via line 60 to the logic circuitry 32 to reset the flip flop $E_8$ and logic circuitry 32.

Then the microprocessor 46 will determine which reference voltage crossing has occurred and the point in time when it has occurred, and what is the $\Delta t$ since the last reference voltage crossing.

Subsequently, on the next reference voltage crossing, the above sequence of events is repeated to cause the latch 36 to latch the logic values at the inputs 38 and 40 and the count from the counter 50. Then this data regarding the point in time when the transition occurred and which transition occurred is inputted to the microprocessor 46 after which an interrupt dismiss signal is outputted at 58 to the reset input R of the control flip flop $E_8$ and over the line 60 to the logic circuitry 32. It will be apparent that this sequence is repeated over and over and the data collected utilized to analyze the waveform.

As shown, logic circuitry 32 includes a first flip flop $E_3$ having an input D coupled to the output 28 from the first comparator $E_1$ and a second flip flop $E_4$ has an input D coupled to the output 30 of the second comparator $E_2$. The clock inputs 61 and 62 of each of the flip flops $E_3$ and $E_4$ are coupled to the line 60 connected to the interrupt dismiss output 58 from the microprocessor 46.

Output Q from the first flip flop $E_3$ is coupled to one input 63 of an XOR gate $E_5$, the other input 65 of which is coupled to output 28 from the comparator $E_1$. In a similar manner the output Q from the flip flop $E_4$ is coupled to one input 64 of an XOR gate $E_6$, the other input 66 of which is coupled to the output 30 from the second comparator $E_2$.

The output of the XOR gate $E_5$ is supplied to input 75 of an OR gate $E_7$ and the output of the XOR gate $E_6$ is supplied to input 76 of OR gate $E_7$, the output 34 of which is the output from the logic circuitry 32.

Turning now to FIG. 2 and refering to logic circuitry 32, one can follow or track the instantaneous value of the waveform S over a time period covering at least one cycle. Starting from a value of waveform S below $-R$, five reference voltage crossings are sensed at $t_1, t_2, t_3, t_4,$ and $t_5$. The logic switching within, and the data generated by, the logic circuitry 32 as these crossings occur is set forth in Table I below.

TABLE I

| Instantaneous value of S | Time | INTDIS Signal | Logic at 28 of $E_1$ | Logic at 30 of $E_2$ | Logic at Q of $E_3$ | Logic at Q of $E_4$ | Logic output of $E_5$ | Logic output of $E_6$ | Logic at 34 of $E_7$ |
|---|---|---|---|---|---|---|---|---|---|
| $S < -R$ | $t < t_1$ | — | 0 | 0 | 0 | 0 | 0 | 0 | 0 |
| $-R < S < +R$ | $t_1 < t < t_2$ | — | 0 | 1 | 0 | 0 | 0 | 1 | 1 |
| $-R < S < +R$ | $t_1 < t < t_2$ | pulse | 0 | 1 | 0 | 1 | 0 | 0 | 0 |
| $S > +R$ | $t_2 < t < t_3$ | — | 1 | 1 | 0 | 1 | 1 | 0 | 1 |
| $S > +R$ | $t_2 < t < t_3$ | pulse | 1 | 1 | 1 | 1 | 0 | 0 | 0 |
| $-R < S < +R$ | $t_3 < t < t_4$ | — | 0 | 1 | 1 | 1 | 1 | 0 | 1 |
| $-R < S < +R$ | $t_3 < t < t_4$ | pulse | 0 | 1 | 0 | 1 | 0 | 0 | 0 |
| $S < -R$ | $t_4 < t < t_5$ | — | 0 | 0 | 0 | 1 | 0 | 1 | 1 |
| $S < -R$ | $t_4 < t < t_5$ | pulse | 0 | 0 | 0 | 0 | 0 | 0 | 0 |
| $-R < S < +R$ | $t_5 < t$ | — | 0 | 1 | 0 | 0 | 0 | 1 | 1 |

From the foregoing, it is apparent that the apparatus 10 functions to record the exact time of each and every reference crossing by the voltage waveform or signal S, be it $+R$ or $-R$.

The time is determined by the count in binary counter 50 and there are four types of reference crossings which must be distinguished in order to properly compute the various $\Delta T$'s required in a current sensing algorithm. The four types are: (1) rising through the $-R$ level, (2) rising through the $+R$ level, (3) falling through the $+R$ level, and (4) falling through the $-R$ level. With each time value (count) which is recorded as shown in the above Table, a two bit binary status number is also recorded to help distinguish which of the four types of crossings the recorded time is associated with. The two bit binary number is generated by the logic outputs of comparators $E_1$ $E_2$, with $E_1$ being the most significant bit. Therefore, a status number of 00 is associated with signals in the range less than $-R$. Such signal levels can only be attained by transition 4 above, that is, by passage downward through $-R$. Similarly, status code 11 is associated with signal levels above $+R$ which are attainable only by upward transitions through +R as by transition 2 above. The code 01 represents signal levels between +R and −R and can be reached by either of two transitions (1 and 3 above). In order to distinguish which is involved, the microprocessor 46 must retain information about the previous transition to prevent ambiguity. Status code 10 is unattainable except via failure of the logic elements As shown in FIG. 2, comparator $E_1$ detects crossings of the +R reference level by the signal while comparator $E_2$ detects crossings of the −R level. When a crossing of either occurs, the status of both comparators as well as that of the counter 50 is latched by latch 36 until such time as that information can be read by the microprocessor 46. Simultaneously, with the latching of data in latch 36 flip flop $E_8$ is set by the clock signal to clock input 42 to signal the microprocessor 46 via its interrupt request input 56 that new data is present in the latch 36 and must be read before the next reference transition occurs.

After performing the read operations, the microprocessor 46 issues an interrupt dismiss signal (INT-DIS) which resets the flip flop $E_8$ and simultaneously via line 60 to clock inputs 61 and 62 clocks the flip flops $E_3$ and $E_4$ latching the present state of the comparators $E_1$ and $E_2$.

Both inputs of each of the XOR gates $E_5$ and $E_6$ will be at the same logic level and the resulting zero logic level at output 34 of $E_7$ will prevent further issuance of an interrupt request signal until such time as a crossing occurs. When one does occur, one of the comparator outputs will change and either the output of XOR gates $E_5$ or $E_6$ will assume a high logic level output. The signal will propagate through OR gate $E_7$ causing a new set of data to be latched into latch 36 and also setting flip flop $E_8$ which requests another processor interrupt operation repeating the entire cycle.

By a series of subtractions performed by the microprocessor 46, certain $\Delta t$ values are computed. It is to be noted that the frequency is easily obtained as $1/(t_5 - t_1)$.

The amplitude A of the sinusoidal component and the value of the DC offset can then be computed in the following manner:

With reference to FIG. 2, assume that the current value is expressed by the following formula:

$$i = C + A \sin \omega t$$

where A is the amplitude and C is the DC offset.

At time $t_1$ the waveform or signal S rises through the negative reference −R so that:

$$-R = C + A \sin \omega t_1 \qquad \text{(Eq. 1)}$$

At $t_2$, the waveform S rises through the positive reference voltage +R so that:

$$R = C + A \sin \omega t_2 \qquad \text{(Eq. 2)}$$

At $t_3$ the waveform S crosses the positive reference voltage +R in a descending direction. Since $\omega t_3$ is greater than $\pi$ radians while $\omega t_2$ occurs before $\pi$ radians, one can express the same function of $\sin \omega t_3$ as:

$$\sin(\pi - \omega t_3)$$

Then,:

$$R = C + A \sin(\pi - \omega t_3) \qquad \text{(Eq. 3)}$$

Now, the above equations can be solved as follows for $t_1$, $t_2$ and $t_3$:

$$\omega t_1 = -\sin^{-1}\left(\frac{R+C}{A}\right)$$

$$\omega t_2 = \sin^{-1}\left(\frac{R-C}{A}\right)$$

$$\omega t_3 = \pi - \sin^{-1}\left(\frac{R+C}{A}\right)$$

Then:

$$\omega(t_2 - t_1) = \sin^{-1}\left(\frac{R-C}{A}\right) + \sin^{-1}\left(\frac{R+C}{A}\right)$$

$$\omega(t_3 - t_2) = \pi - 2\sin^{-1}\left(\frac{R-C}{A}\right)$$

These equations can be maniplulated to provide:

$$\frac{1}{2}\omega(t_3 - t_2) + \omega(t_2 - t_1) = \frac{\pi}{2} - \sin^{-1}\left(\frac{R-C}{A}\right) +$$

$$\sin^{-1}\left(\frac{R-C}{A}\right) + \sin^{-1}\left(\frac{R+C}{A}\right)$$

Combining, we have:

$$\frac{1}{2}\omega(t_3 - t_2) + \omega(t_2 - t_1) = \frac{\pi}{2} + \sin^{-1}\left(\frac{R+C}{A}\right) \qquad \text{(Eq. 4)}$$

We then have:

$$\frac{1}{2}\omega(t_3 - t_2) = \frac{\pi}{2} - \sin^{-1}\left(\frac{R-C}{A}\right) \qquad \text{(Eq. 5)}$$

We then define $\alpha$ and $\beta$ as:

$$\alpha = \frac{\omega}{2}(t_2 - t_1) = \pi \frac{(t_2 - t_1)}{(t_5 - t_1)}$$

$$\beta = \frac{\omega}{2}(t_3 - t_1) = \pi \frac{(t_3 - t_1)}{(t_5 - t_1)}$$

Equations 4 & 5 become:

$$\beta + \alpha = \frac{\pi}{2} + \sin^{-1}\left(\frac{R+C}{A}\right) \qquad \text{(Eq. 6)}$$

and $$\beta - \alpha = \frac{\pi}{2} - \sin^{-1}\left(\frac{R-C}{A}\right) \qquad \text{(Eq. 7)}$$

Now, take the cosine of Equations 6 and 7 to yield:

$$\cos(\beta + \alpha) = \cos\frac{\pi}{2} \cdot \cos\sin^{-1}\left(\frac{R+C}{A}\right) - \sin\frac{\pi}{2} \cdot \quad \text{(Eq. 8)}$$

$$\sin\sin^{-1}\left(\frac{R+C}{A}\right)$$

$$\cos(\beta - \alpha) = \cos\frac{\pi}{2} \cdot \cos\sin^{-1}\left(\frac{R-C}{A}\right) + \sin\frac{\pi}{2} \cdot \quad \text{(Eq. 9)}$$

$$\sin\sin^{-1}\left(\frac{R-C}{A}\right)$$

$$\cos\frac{\pi}{2} = 0 \text{ and } \sin\frac{\pi}{2} = 1,$$

therefore:

$$\cos(\beta + \alpha) = -\frac{R+C}{A} \quad \text{(Eq. 10)}$$

$$\cos(\beta - \alpha) = \frac{R-C}{A} \quad \text{(Eq. 11)}$$

Equations 10 and 11 are now solved for A and C.

$$\cos(\beta + \alpha) + \cos(\beta - \alpha) = -\frac{2C}{A} \quad \text{(Eq. 12)}$$

$$\cos(\beta - \alpha) - \cos(\beta + \alpha) = \frac{2R}{A}$$

$$A = \frac{2R}{\cos(\beta - \alpha) - \cos(\beta + \alpha)}$$

$$C = R\frac{\cos(\beta - \alpha) + \cos(\beta + \alpha)}{\cos(\beta - \alpha) - \cos(\beta + \alpha)}$$

$$A = \frac{2R}{\cos\beta\cos\alpha + \sin\beta\sin\alpha - \cos\beta\cos\alpha + \sin\beta\sin\alpha}$$

$$A = \frac{R}{\sin\alpha\sin\beta}$$

Then, solve for C as follows:

$$C = R\frac{\cos\beta\cos\alpha + \sin\beta\sin\alpha + \cos\beta\cos\alpha - \sin\beta\sin\alpha}{\cos\beta\cos\alpha + \sin\beta\sin\alpha - \cos\beta\cos\alpha + \sin\beta\sin\alpha} \quad \text{(Eq. 13)}$$

$$= R\frac{2\cos\beta\cos\alpha}{2\sin\beta\sin\alpha}$$

$$C = \frac{R}{\tan\alpha\tan\beta}$$

If the wave form is a pure sinusoid of known frequency, then only $t_1$ and $t_2$ need be measured and the rms value of the waveform is given by:

$$I(\text{rms}) = \frac{R}{\sqrt{2}\,\sin(\pi f(t_2 - t_1))}$$

In characterizing a waveform such as a waveform S from reference value crossing times, it is necessary to make certain assumptions about the general character of the waveform. In the example set forth above, it was assumed that the waveform contained a pure sinusoidal component and a DC component with no harmonics present. Such assumptions are often made in analyzing sinusoidal wave forms. However, in the real world, harmonics are always present to some degree.

With the method of the present invention as practiced with the apparatus 10 of the present invention, a waveform is assumed to contain a second harmonic along with a DC component. The method then must be able to determine five parameters which are: (1) the magnitude of the DC component, (2) the amplitude of the fundamental, (3) the amplitude of the second harmonic, (4) the frequency of the fundamental, and (5) the phase displacement of the harmonic component. In order to calculate the five unknown quantities, at least five independent $\Delta t$ values must be obtained from the data stream being scanned by the apparatus 10.

Measurements are made at the + and −R values to provide four independent quantities which are sufficient to provide three characteristic parameters as in the example set forth above where the DC component, the AC component and the frequency were determined. If the zero crossing points are timed in addition, enough information is available to uniquely calculate six characterization parameters of the waveform.

In general, a waveform such as the waveform S need not be resolved into traditional mathematical forms to be useful to a decision making procedure within a data processor. In any practical application of the measurement method of the present invention, waveforms may be better characterized in quantities such as duration, variation between positive and negative loops, skew, peakedness, etc., rather than in terms of the Fourier coefficient.

For example, the rms value of the total current wave under short circuit at any instant is the square root of the sum of the squares of the direct current component and the rms value of the alternating current component at that instant.

It would, however, be time consuming, even with microprocessor 46, to calculate this short circuit current. Accordingly, for short circuit or fault current detection, the microprocessor 46 can be programmed to cause a "trip" or circuit interrupt signal 70 to be sent to a circuit breaker to open the circuit whenever $t_2 - t_1$ or $t_4 - t_3$ is less than a predetermined $\Delta T$.

An example of a high speed algorithm for time current curve (TCC) action in a recloser control that utilizes the data supplied by the apparatus 10 of the present invention to the microprocessor 46 is set forth below.

The raw data input to the microprocessor 46 which is used to determine the current level is a string of time values; four per power line cycle for each circuit being measured. If subtraction operations are performed on appropriate pairs of the time values, a sequence of $\Delta t$'s will be obtained which is a measure of di/dt at current zero. The timing toward trip which the recloser must do should be based on an rms current, so it is necessary to develop an equivalence between di/dt at current zero and the associated rms AC current.

To have an effective high speed algorithm one must eliminate all unnecessary work by the microprocessor 46. So, rather than using a $\Delta t$ to caluculate a di/dt to calculate an rms current and then using the current as an argument in a TCC function which evaluates to a trip time, instead merely look up the trip time in a table which is organized in two columns; $\Delta t$ values in one and trip times in the other. This method is extremely fast.

A further improvement in speed and reduction in memory requirement can be made by eliminating half of the table, namely the column of $\Delta t$ values. The arrangement can be such that the sought after value for time to trip is located in memory at an address which is the location of the start of the table plus the value of $\Delta t$. (Note, $\Delta t$ is, of course, an integer). This is the ultimate in simplification since no searching at all is required to find the table entry. Unfortunately, the table is still very long. For the recloser application, a comparator is set at a reference level corresponding to 100 amperes and a time counter operates at a frequency so that it counts to 16384 during a 1/60 second power line cycle. The maximum value for any $\Delta t$ is thus 8192 and it corresponds to 100 amperes. A $\Delta t$ of such range requires that the table have 8192 entries.

Some speed of operation can be sacrificed to achieve a more compact table and thus save memory space. That portion of the table for large $\Delta t$'s is of little use. A count of 8192 corresponds to 100 amps while 8191 corresponds to 100.000002 amps. It is obvious that some kind of compression should be used at the high $\Delta t$ end of the table. If entries were made via log ($\Delta t$), a much more efficient table would result, but calculating logarithms is an extremely time consuming task or at least relatively so for a real time microprocessor controller.

For acceptable operation of a recloser control, it is sufficient if only 256 distinguishable levels of current exist so long as they are fairly uniformly spaced in a geometrical progression throughout the 100 to 30,000 ampere working range. A step to step increase of only 2.25% is required to cover the 300 to 1 range. Now, if the 8192 possible raw $\Delta t$ values can be grouped into 256 ranges of current, each of which has an associated time to trip value, the TCC table only needs to contain 256 items instead of 8192. One way to compute the proper table line numbers, 0 to 255, from the $\Delta t$ values 0 to 8192 is set forth below. Although the following description may appear cumbersome, the computation is performed with "blinding speed" in a binary machine because it requires only a right shift and a single addition. As set forth in Table II below, a division by $2^n$ is an n place right shift.

TABLE II

| $\Delta t$ Range | Transformation | Result Range |
|---|---|---|
| 0–15 | 0 | 0 |
| 16–63 | $\Delta t - 16$ | 0–47 |
| 64–127 | $\Delta t/2 + 16$ | 48–79 |
| 128–255 | $\Delta t/4 + 48$ | 80–111 |
| 256–511 | $\Delta t/8 + 80$ | 112–143 |
| 512–1023 | $\Delta t/16 + 112$ | 144–175 |
| 1024–2047 | $\Delta t/32 + 144$ | 176–207 |
| 2048–4095 | $\Delta t/64 + 176$ | 208–239 |
| 4096–8192 | $\Delta t/256 + 224$ | 240–255 |

If the waveform or signal S is made up of a fundamental and second harmonic with no, or very little, third or higher harmonics and with no DC offset, the apparatus 10 can be utilized to measure the fundamental component $S_1$ and second harmonic component $S_2$ of the waveform S.

Each signal component $S_1$ and $S_2$ is considered to be composed of a sine wave component and a cosine quadrature component. This allows a "zero point" to be selected at any convenient position along the time axis. For example as shown in FIG. 3 $t_0$ can be at the upward crossing of $-R$ reference value, $t_1$ at the upward crossing of $+R$, $t_2$ being at the downward crossing of $+R$ and $t_4$ being at the upward crossing of $-R$. The time units are in radians (at the fundamental frequency). Then the signal can be written as:

$$S = A \sin t + B \cos t + C \sin (2t) + D \cos (2t)$$

The wave shape is thus completely characterized by the four constants A, B, C and D. The amplitude of the fundamental is then $$\sqrt{A^2 + B^2}$$

while the amplitude of the second harmonic is $$\sqrt{C^2 + D^2} .$$

The computational algorithm for determination of the four constants consists of the solution of four independent linear simultaneous equations involving the four unknown constants. The equations are obtained by considering the equation for S at each of the reference crossings $t_0$ through $t_3$. They are $$-R = A \sin 0 + B \cos 0 + C \sin 0 + D \cos 0 = B + C$$

$$+R = A \sin t_1 + B \cos t_1 + C \sin 2t_1 + D \cos 2t_1$$

$$+R = A \sin t_2 + B \cos t_2 + C \sin 2t_2 + D \cos 2t_2$$

$$-R = A \sin t_3 + B \cos t_3 + C \sin 2t_3 + D \cos 2t_3$$

The above set is easily solved for A, B, C and D since $t_1$, $t_2$ and $t_3$ are all known. Cramers method, for example, may be used:

$$A = \frac{\begin{vmatrix} -R & 1 & 0 & 1 \\ +R & \cos t_1 & \sin 2t_1 & \cos 2t_1 \\ +R & \cos t_2 & \sin 2t_2 & \cos 2t_2 \\ -R & \cos t_3 & \sin 2t_3 & \cos 2t_3 \end{vmatrix}}{\begin{vmatrix} 0 & 1 & 0 & 1 \\ \sin t_1 & \cos t_1 & \sin 2t_1 & \cos 2t_1 \\ \sin t_2 & \cos t_2 & \sin 2t_2 & \cos 2t_2 \\ \sin t_3 & \cos t_3 & \sin 2t_3 & \cos 2t_3 \end{vmatrix}}$$

$$B = \frac{\begin{vmatrix} 0 & -R & 0 & 1 \\ \sin t_1 & R & \sin 2t_1 & \cos 2t_1 \\ \sin t_2 & R & \sin 2t_2 & \cos 2t_2 \\ \sin t_3 & -R & \sin 2t_3 & \cos 2t_3 \end{vmatrix}}{\begin{vmatrix} 0 & 1 & 0 & 1 \\ \sin t_1 & \cos t_1 & \sin 2t_1 & \cos 2t_1 \\ \sin t_2 & \cos t_2 & \sin 2t_2 & \cos 2t_2 \\ \sin t_3 & \cos t_3 & \sin 2t_3 & \cos 2t_3 \end{vmatrix}}$$

$$C = \frac{\begin{vmatrix} 0 & 1 & -R & 1 \\ \sin t_1 & \cos t_1 & R & \cos 2t_1 \\ \sin t_2 & \cos t_2 & R & \cos 2t_2 \\ \sin t_3 & \cos t_3 & -R & \cos 2t_3 \end{vmatrix}}{\begin{vmatrix} 0 & 1 & 0 & 1 \\ \sin t_1 & \cos t_1 & \sin 2t_1 & \cos 2t_1 \\ \sin t_2 & \cos t_2 & \sin 2t_2 & \cos 2t_2 \\ \sin t_3 & \cos t_3 & \sin 2t_3 & \cos 2t_3 \end{vmatrix}}$$

$$D = \frac{\begin{vmatrix} 0 & 1 & 0 & -R \\ \sin t_1 & \cos t_1 & \sin 2t_1 & R \\ \sin t_2 & \cos t_2 & \sin 2t_2 & R \\ \sin t_3 & \cos t_3 & \sin 2t_3 & -R \end{vmatrix}}{\begin{vmatrix} 0 & 1 & 0 & 1 \\ \sin t_1 & \cos t_1 & \sin 2t_1 & \cos 2t_1 \\ \sin t_2 & \cos t_2 & \sin 2t_2 & \cos 2t_2 \\ \sin t_3 & \cos t_3 & \sin 2t_3 & \cos 2t_3 \end{vmatrix}}$$

From the foregoing description it will be apparent that the method and apparatus of the present invention have a number of advantages, some of which have been described above and others of which are inherent in the invention. Specifically, the present invention provides a simple, relatively inexpensive method and apparatus 10 for digitally measuring an alternating current, that is to say, for measuring four or five points in time where the instantaneous value of the wave is equal to one or the other of two reference values and for using that data to determine at least the frequency, DC offset and amplitude of the waveform.

Also it will be apparent from the foregoing description that modifications can be made to the method and apparatus 10 of the present invention without departing from the teachings of the invention. Accordingly, the scope of the invention is only to be limited as necessitated by the accompanying claims.

I claim:

1. A method for measuring an alternating waveform comprising the steps of: sensing when the waveform exceeds a predetermined negative reference value and remembering the point in time $t_1$ when this occurs; sensing when the waveform exceeds a predetermined positive reference value and remembering the point in time $t_2$ when this occurs; sensing when the waveform falls below the predetermined positive reference value and remembering the point in time $t_3$ when this occurs; sensing when the waveform falls below a predetermined negative reference value and remembering the point in time $t_4$ when this occurs; sensing when the waveform again exceeds the predetermined negatrve reference value and remembering the point in time $t_5$ when this occurs; determining from $t_5-t_1$ the frequency of the waveform and determining from the negative and positive reference values and the time increments $t_2-t_1$, $t_3-t_1$, and $t_5-t_1$ the size of any DC offset and the amplitude of the fundamental of the waveform.

2. The method according to claim 1 wherein the absolute magnitude of the negative reference value equals the absolute magnitude of the positive reference value.

3. The method according to claim 1 wherein said reference values are DC voltages.

4. The method according to claim 1 wherein said waveform is a voltage waveform.

5. The method according to claim 4 wherein said voltage waveform is developed from a current P,ming g transformer so that said waveform is directly related to an alternating current to be measured.

6. A method according to claim 1 wherein said $t_2-t_1$ is compared with a predetermined $\Delta T$ and when $t_2-t_1$ is less than $\Delta T$, causing a control signal to be generated for actuating a circuit interrupter in the line carrying the alternating current.

7. A method according to claim 1 wherein said $t_4$ and said $t_3$ are used to calculate an interval $t_4-t_3$ which is compared with a predetermined $\Delta T$ and when $t_4-t_3$ is less than $\Delta T$ causing a control signal to be generated for actuating a circuit interrupter in the line carrying the alternating current.

8. An apparatus for measuring and monitoring an alternating current including: means for developing a voltage waveform directly related to the alternating current to be measured and monitored; first sensing means for sensing when the voltage waveform crosses a predetermined negative reference voltage; memory means for remembering the point in time $t_1$ when this occurs; second sensing means for sensing when the voltage waveform crosses a predetermined positive reference voltage; said memory means being operable to remember the point in time $t_2$ when this occurs; comparing means associated with said memory means and operable therewith for comparing $t_2-t_1$ with a predetermined $\Delta T$ and, when $t_2-t_1$ is less than $\Delta T$, said comparing means causes a control signal to be generated for actuating a circuit interrupter in the line carrying the alternating current.

9. An apparatus for measuring a sinusoidal alternating current of known frequency including: means for developing a voltage waveform directly related to the alternating current to be measured; first sensing means for sensing when the voltage waveform crosses a predetermined negative reference voltage $-R$; memory means for remenbering the point in time $t_1$ when this occurs; second sensing means for sensing when the voltage waveform crosses a predetermined positive reference voltage $+R$; said memory means being operable to remember the point in time $t_2$ when this occurs; and data processing means associated with said memory means and operable therewith for computing the RMS value of the current by solving the equation:

$$I(\text{rms}) = \frac{R}{\sqrt{2} \ \sin(\pi f(t_2 - t_1))}$$

10. An apparatus for measuring an alternating waveform comprising first sensing means for sensing when the waveform exceeds a predetermined negative reference value; memory means for remembering the point in time $t_1$ when this occurs; second sensing means for sensing when the waveform exceeds a predetermined positive reference value; said memory means being operable to remember the point in time $t_2$ when this occurs; said second sensing means being operable to sense when the waveform falls below the predetermined positive reference value and said memory means being operable to remember the point in time $t_3$ when this occurs; said first sensing means being operable to sense when the waveform falls below a predetermined negative reference value and said memory means being operable to remember the point in time $t_4$ when this occurs; said first sensing means then being operable to sense when the waveform again exceeds the negative reference value and said memory means being operable to remember the point in time $t_5$ when this occurs; and data processing means for determining from $t_5-t_1$ the frequency of the waveform, and for determining from the negative and positive reference values and the time increments $t_2-t_1$, $t_3-t_1$, and $t_5-t_1$ the size of any DC offset present in the waveform and the amplitude of the fundamental of the waveform.

11. An apparatus for digitally measuring an alternating current comprising: means for transofrming the alternating current waveform to a voltage waveform; a first sensing means for sensing when the instantaneous value of the voltage waveform crosses a first reference voltages; a second sensing means for sensing when the instantaneous value of the voltage waveform crosses a second reference voltage; latch means coupled to the output of said sensing means; a counter coupled to the input to said latch means for supplying a count to said latch; said latch being operable to latch simultaneously a voltage reference crossing sensed by said sensing means and the count in the counter at the time of the crossing; data processing means coupled to the output of said latch means; logic circuitry coupled to and between said sensing means, said latch means and said data processing means first for causing, after being actuated by a reference voltage crossing, said latch means to latch a reference voltage crossing and the count at that point in time in said latch means and second for causing said data processing means first to read the values latched in said latch means and second to send a reset signal to said logic circuitry for resetting same for the next reference voltage crossing.

12. The apparatus according to claim 11 wherein said first and second sensing means comprise first and second comparators each of which has one input coupled to the output of said transforming means and the other input coupled to one of said reference volages.

13. The apparatus according to claim 12 wherein the outputs of said comparators are coupled to inputs of said latch means and to inputs of said logic circuitry.

14. The apparatus according to claim 13 wherein said logic circuitry has an output coupled directly to a clock input of said latch means and to a delay circuit which in turn is coupled to said data processing means.

15. The apparatus according to claim 13 wherein said delay circuit comprises a control flip flop, said output from said logic circuitry being connected to a clock input of said control flip flop and the output from said flip flop being coupled to an interrupt request input of said data processing means.

16. The apparatus according to claim 15 wherein said logic circuitry comprises first and second flip flops each having a data input coupled to the output from one of said comparators.

17. The apparatus according to claim 16 wherein said data processing means have an interrupt dismiss output which is coupled to a reset input of said control flip flop and to the clock input of each of said first and second flip flops.

18. The apparatus according to claim 17 wherein said logic circuitry includes first and second XOR gates one input of which is coupled to the output of one of said first and second flip flops and the other input of which is coupled to the output of one of said comparators, and wherein said logic circuitry also includes an OR gate having one input coupled to the output of said first XOR gate and another input coupled to the output of said second XOR gate, and the output of said OR gate being coupled to the clock input of said latch means and a clock input of said control flip flop.

19. The apparatus according to claim 11 wherein said transforming means comprise a current transformer.

20. The apparatus according to claim 11 wherein said counter has a clock input whick is coupled to the system clock of said data processing means and is operated off said system clock.

21. A method for measuring the fundamental and second harmonic of an alternating waveform which has no other harmonics of any sighificance and no DC offset comprising the steps of: sensing when the waveform exceeds a predetermined negative reference value and remembering the point in time $t_0$ when this occurs; sensing when the waveform exceeds a predetermined positive reference value and remembering the point in time $t_1$ when this occurs; sensing when the waveform falls below the predetermined positive reference value and remembering the point in time $t_2$ when this occurs; sensing when the waveform falls below a predetermined negative reference value and remembering the point in time $t_3$ when this occurs; determining, such as by means of Cramer's method, from $t_0$, $t_1$, $t_2$ and $t_3$ the fundamental and second harmonic of the waveform.

22. An apparatus for measuring the fundamental and second harmonic of an alternating waveform which has no other harmonics of any significance and no DC offset comprising first sensing means for sensing when the waveform exceeds a predetermined negative reference value; memory means for remembering the point in time $t_0$ when this occurs; second sensing means for sensing when the waveform exceeds a predetermined positive reference value; said memory means being operable to remember the point in time $t_1$ when this occurs; said second sensing means being operable to sense when the waveform falls below the predetermined positive reference value and said memory means being operable to remember the point in time $t_2$ when this occurs; said first sensing means being operable to sense when the waveform falls below a predetermined negative reference value and said memory means being operable to remember the point in time $t_3$ when this occurs; and data processing means for determining, such as by applying Cramer's method, from $t_0$, $t_1$, $t_2$, and $t_3$, the fundamental and second harmonic of the waveform.

* * * * *